US006881142B1

(12) United States Patent
Nair

(10) Patent No.: US 6,881,142 B1
(45) Date of Patent: Apr. 19, 2005

(54) INTELLIGENT NETWORKED FAN ASSISTED TILES FOR ADAPTIVE THERMAL MANAGEMENT OF THERMALLY SENSITIVE ROOMS

(75) Inventor: Rajesh M. Nair, Nashua, NH (US)

(73) Assignee: Degree C, Milford, NH (US)

( * ) Notice: Subject to any disclaimer, the term of this patent is extended or adjusted under 35 U.S.C. 154(b) by 0 days.

(21) Appl. No.: 10/660,943

(22) Filed: Sep. 12, 2003

(51) Int. Cl.[7] ............................................. F24F 7/007
(52) U.S. Cl. .................... 454/186; 236/49.3; 454/229; 454/252
(58) Field of Search ............................... 454/186, 187, 454/228, 229, 230, 233, 236, 239, 252; 236/49.3

(56) References Cited

U.S. PATENT DOCUMENTS

| 4,874,127 A | * | 10/1989 | Collier | 236/49.5 |
| 5,345,779 A | * | 9/1994 | Feeney | 62/259.2 |
| 5,718,628 A | * | 2/1998 | Nakazato et al. | 454/184 |
| 5,910,045 A | * | 6/1999 | Aoki et al. | 454/186 |
| 6,557,624 B1 | * | 5/2003 | Stahl et al. | 165/53 |

FOREIGN PATENT DOCUMENTS

| JP | 04028934 A | * | 1/1992 | F24F/3/00 |

* cited by examiner

Primary Examiner—Harold Joyce
(74) Attorney, Agent, or Firm—Schwegman, Lundberg, Woessner & Kluth, P.A.

(57) ABSTRACT

A technique to provide well-balanced airflow in a computer data center that uses fan assisted tiles coupled to a host computer through a network. In an example embodiment, this is accomplished by disposing the fan tiles, including temperature and airflow sensors and a programmable switch to provide a Network address, in multiple locations in raised floor and ceiling of the computer data center. Further, the example embodiments includes coupling the fan tiles to the host computer through the network to control the fan tiles based on the feedback received from the temperature and airflow sensors to provide adaptive airflow balancing and thermal management in the computer data center.

45 Claims, 3 Drawing Sheets

INTELLIGENT NETWORKED FAN ASSISTED TILES FOR ADAPTIVE THERMAL MANAGEMENT OF THERMALLY SENSITIVE ROOMS

TECHNICAL FIELD OF THE INVENTION

The present invention relates generally to thermal management of thermally sensitive rooms, and more particularly to thermal management of a computer data center.

BACKGROUND OF THE INVENTION

The computer data centers typically, consist thousands of racks each with multiple computing units. The computing units can include multiple microprocessors, each dissipating approximately 250 W of power. The heat dissipation from a rack containing such computing units can exceed 10 KW. Today's computer data center, with about 1000 racks and occupying over 30,000 square feet can require about 10 MW of power for the computing infrastructure. A 100,000 square foot computer data center of tomorrow can require 50 MW of power for the computing infrastructure. Energy required to dissipate this heat can be an additional 20 MW. A hundred thousand square foot planetary scale computer data center, with five thousand 10 KW racks, can cost about 44 million dollars per year (at $100/MWh) just to power the servers and about 18 million dollars per year to power the cooling infrastructure for the computer data center.

Cooling design consideration by virtue of proper layout of racks and fans can yield substantial savings in energy. Generally, cooling design in a high power density computer data center is quite complex. Today's intuitive distribution of air does not suffice in providing a well-balanced airflow in a computer data center such that every location in the computer data center receives a uniform airflow to improve operating efficiency and cooling performance.

In addition, many of the computer data centers are hastily planned and implemented as the needed equipment must be quickly installed on a rush schedule. The typical result is a somewhat haphazard layout on the raised floor that can have disastrous consequences due to environmental temperature disparities. Unfortunately, the dangers of this lack of planning are, is not apparent until after serious reliability problems have already occurred. Further, any changes in a computer data center due to traffic patterns, equipment changes and additions, blocked filters, failed fans, and so on can affect thermal load distribution, which in turn can affect the well-balanced airflow in a computer data center.

SUMMARY OF THE INVENTION

The present invention provides a technique for providing a well-balanced airflow in a room having many heat generating elements, such as a computer data center. In one example embodiment, the technique provides dynamic airflow balancing and thermal management for the computer data center. This is accomplished by disposing multiple fan tiles at various locations in a raised floor and ceiling of a computer data center that are connected to a host computer through a data network. Each of the disposed networked fan tiles in the raised floor and the ceiling is controlled by the host computer based on sensing incoming airflow and outgoing air temperature, respectively, to achieve well-balanced airflow in the computer data center.

DETAILED DESCRIPTION OF THE INVENTION

The present subject matter provides a technique for providing a well-balanced airflow in a room. The technique further provides a dynamic airflow balancing and thermal management for a computer data center.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims. The terms "thermal server", "host computer", "remote server", and "remote computer" are used interchangeably throughout the document. In addition, the terms "power controller" and "micro-controller" are also used interchangeably throughout the document and refer to a means used to vary the speed of the one or more fans in the fan tile assembly.

Figure 1:
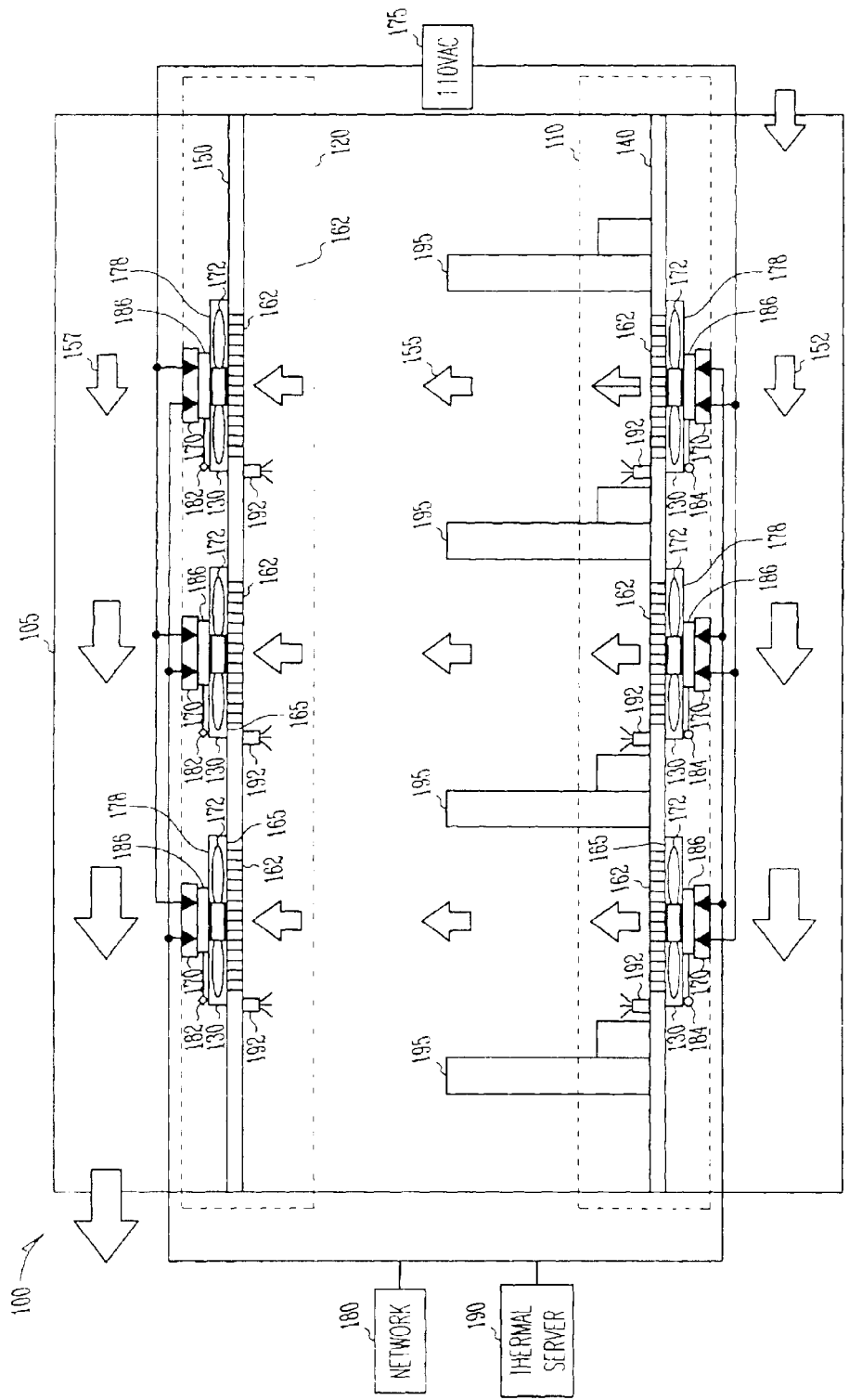
FIG. 1 is a schematic diagram of a side elevational view of one example embodiment of a computer data center including multiple fan assisted tiles according to the present subject matter.

Referring now to FIG. 1, there is illustrated an example embodiment of a thermal management system 100 according to the present subject matter. The thermal management system 100 includes a first array 110 of fan assisted tiles 130, disposed in the raised floor 140 of a room 105, and a second array 120 of fan assisted tiles 130, disposed in the ceiling 150 of the room 105. The room 105 can be a computer data center including heat generating components 195.

As shown in FIG. 1, each fan assisted tile 130 includes a plurality of passageways 162 for the air to enter and exhaust from the room 105. Further as shown in FIG. 1, each fan assisted tile 130 can be attached to a fan tile 135 that is adaptable to be disposed on the ceiling 150 and/or the raised floor 140 of the room 105. In some embodiments, the fan tile 135 is made of sheet metal tile. In these embodiments, the sheet metal tile has a front side 165 and a back side 178. One or more fans 172 are attached to the back side 178 of the sheet metal tile. The front side 165 of the sheet metal tile is adapted to be disposed on the raised floor 140 and/or ceiling 150 in the room 105.

Also shown in FIG. 1, the thermal management system 100 includes a power source 175, a data network 180, and a remote thermal server 190. The thermal server 190 can be a host computer, a remote server, a remote computer, a remote server, a processor, and other such processors that can facilitate in the thermal management of the room 105. The thermal server 190 can be a remote program capable of communicating over a data network 180. As shown in FIG. 1, each of the fan assisted tiles 130 includes the one or more fans 172, a power controller 186, and an interface 170. In the example embodiment shown in FIG. 1, each of the power controllers 186 is connected to the power source 175 through the interface 170. In addition, as shown in FIG. 1, each of the fan assisted tiles 130 is connected to the thermal server 190 through the interface 170 and via the data network 180. The interface 170 can be a network interface, such as a serial communication interface.

In these embodiments, the first array 110 of fan assisted tiles 130 is disposed on the raised floor 140 such that the air is directed into the room 105 as indicated by directional arrows 152. The second array 120 of fan assisted tiles 130 is disposed in the ceiling 150 such that the air is directed out of the room 105 as indicated by directional arrows 157. In operation, the thermal management system 100 moves the air in the room 105 through the passageways 162 as indicated by directional arrows 152, 155, and 157 to provide adaptive airflow balancing in the room 105.

Also shown in FIG. 1, an airflow sensor 184 is coupled to each of the power controllers 186 in the first array 110 of fan assisted tiles 130. Further, FIG. 1 shows a temperature sensor 182 coupled to each of the power controllers 186 in the second array 120 of fan assisted tiles 130.

FIG. 1 illustrates an example centralized control system for the adaptive control of the environment, such as the room 105. The centralized control in this example embodiment is achieved through the thermal server 190, which communicates with the fan assisted tiles 130 via the network 180. In this example embodiment, the thermal server 190 receives the sensor information, such as airflow and temperature and computes necessary operating parameters, such as fan speed and other commands necessary to operate the fan assisted tiles 130. The computed operating parameters are then sent over the network 180 to each of the fan assisted tiles 130 to provide an adaptive control in the room 105.

Figure 2:
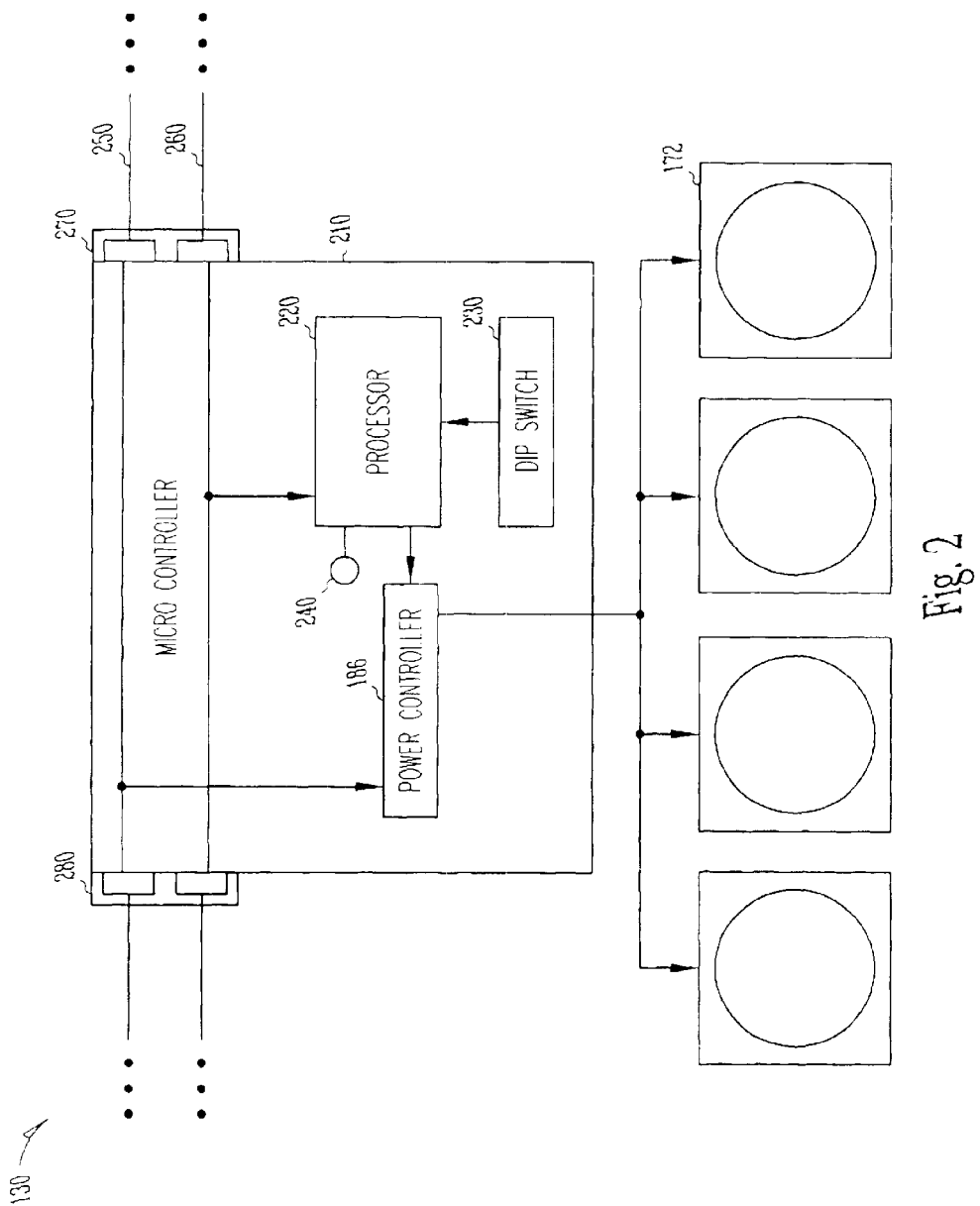
FIG. 2 is a block diagram of a fan assisted tile shown in FIG. 1 according to the present subject matter.

Referring now to FIG. 2, there is illustrated an example embodiment of a fan assisted tile 130 shown in FIG. 1. For example, as shown in FIG. 2, the fan assisted tile 130 includes a fan controller 210 coupled to one or more fans 172. The one or more fans 172 can be one or more axial and/or radial fans.

As shown in FIG. 2, the fan controller 210 includes a processor 220, the power controller 186, DIP switch 230, sensor 240, and in and out interfaces 270 and 280 for daisy chaining with other fan assisted tiles 130. Further, as shown in FIG. 1, the sensor 240 can be the temperature sensor 182, the airflow sensor 184 or any other sensor that is suitable for sensing environmental characteristics and can facilitate in adaptive airflow balancing and thermal management of the room 105. In some embodiments, sensor 240 can be a humidity sensor to sense humidity of air coming into and out of the room 105.

The DIP switch 230 facilitates in setting a Network address, such as an IP address that is unique to each of the fan assisted tiles 130. The DIP switch 230 can be an 8 bit or higher DIP switch. The DIP switch 230 can also be a programmable switch or the like that is suitable for setting a Network address or a unique identifier. As shown in FIG. 2, the fan assisted tile 130 is coupled with other fan assisted tiles by daisy chaining the power and network connections using the interfaces 270 and 280. For example, in FIG. 2, power line 250 and network line 260 are shown isolated. The network line 260 can be an RS485 8 bit addressable connection or a serial communication interface.

In operation, in one example embodiment, each of the temperature sensors 182 and the airflow sensors 184 sense the outgoing air temperature and the incoming airflow, respectively, and the processor 220 outputs a first control signal along with an associated Network address based on the sensed temperature and airflow. The first control signal can be temperature data, airflow data, and/or any other data that facilitates in adaptive airflow balancing or thermal management of the room 105.

In some embodiments, each of the temperature sensors 182 senses the outgoing temperature in the room 105 and the processor 220 outputs a first control signal, and each of the airflow sensors 184 senses the incoming airflow and outputs a second control signal. In these embodiments, the thermal server 190 outputs third and fourth control signals based on the outputted first and second control signals, respectively. Also in these embodiments, each of the fan controllers 210 varies the fan speed of one or more fans 172, in each of the associated fan assisted tiles 130 in the first and second arrays 110 and 120, based on the third and fourth control signals received from the thermal server 190 through the data network 180.

The thermal server 190 receives the outputted first control signal along with the associated Network address from each of the temperature and airflow sensors 182 and 184 through the data network 180, and outputs a second control signal along with the associated Network address based on the received first control signal and the associated Network address from each of the temperature and airflow sensors 182 and 184.

The thermal server 190 sends each of the outputted second control signals along with associated Network addresses through the data network 180 to an associated fan controller 210 of a fan assisted tile 130 based on the received Network address. The fan controller 210 of each fan assisted tile 130 controls the one or more fans 172 based on the received control signal from the thermal server 190 through the data network 180.

In some embodiments, the second control signal is revolutions-per-minute (rpm) data or other such data that can aid in controlling the speed of one or more fans 172. In some embodiments, the microcontroller 210 controls the fan speed of the one or more fans 172 in each fan assisted tile 130 in the first array 110, based on the received associated first control signal, which can be based on the airflow data received from the associated airflow sensor 184. Also in these embodiments, the fan controller 210 controls the fan speed of the one or more fans 172 in each fan assisted tile 130 in the second array 120, based on the received associated second control signal, which can be the temperature data received from the associated temperature sensor 182, to provide adaptive airflow balancing and/or thermal management in the room 105.

Further, FIG. 1 shows an indicator 192 disposed in the room 105, in the ceiling 150 and/or the raised floor 140, to indicate a failed condition of each of the fan assisted tiles 130 should the fan assisted tiles fail during operation. The indicator 192 can be a light and/or an alarm. The light comes on and/or the alarm goes on when any of the associated fan assisted tiles 130 fails during operation. The indicator 192 can be coupled to the fan controller 210, which in turn can be coupled to the thermal server 190 through the data network 180. The fan controller 210 can also include a sensor (not shown) to monitor the status of each of the fan assisted tiles 130 disposed in the first and second arrays 110 and 120. In operation, the sensor can send a fifth control signal to the thermal server 190. The thermal server 190 can monitor the sent fifth control signal and output a sixth control signal to the fan controller 210. The fan controller 210 indicates the failed condition of a fan assisted tile 130 in the first and second arrays 110 and 120, respectively, based on the received sixth control signal.

It can be envisioned that the above-described techniques can also be used in a decentralized control environment, where the controller, such as the thermal server 190 leaves most of the operating decisions to the remote devices, such as the fan assisted tiles 130 and other devices coupled through the data network 130. In these embodiments, the thermal server 190 sends commands to each fan assisted tile 130 to operate at a level to achieve a given airflow or temperature. The decision regarding operating parameters, such as fan speed and other commands are made locally by each of the fan assisted tiles 130. In these embodiments, part of the control functions performed by the thermal server 190 is switched to each of the fan assisted tiles 130 to achieve an adaptive control in the room 105.

In addition, it can also be envisioned that the above-described techniques can be run in a distributed control environment, where each of the fan assisted tiles 130 or any other device can communicate with other fan assisted tiles 130 or devices coupled through the data network 180. Also in these embodiments, each of the fan assisted tiles 130 can compute their own operating parameters to control their fan speeds to achieve an adaptive control in the room 105. In these embodiments, the thermal server 190 would be basically used to monitor, the fan assisted tiles and other such devices connected through the network 180, for proper functioning and to report the status of each of these devices to a facilitator and/or an operator. The advantage of either of the above described architectures, i.e., the decentralized control system and the distributed control system, is that they can considerably reduce the communication traffic sent over the data network 180 to enhance system performance.

Figure 3:
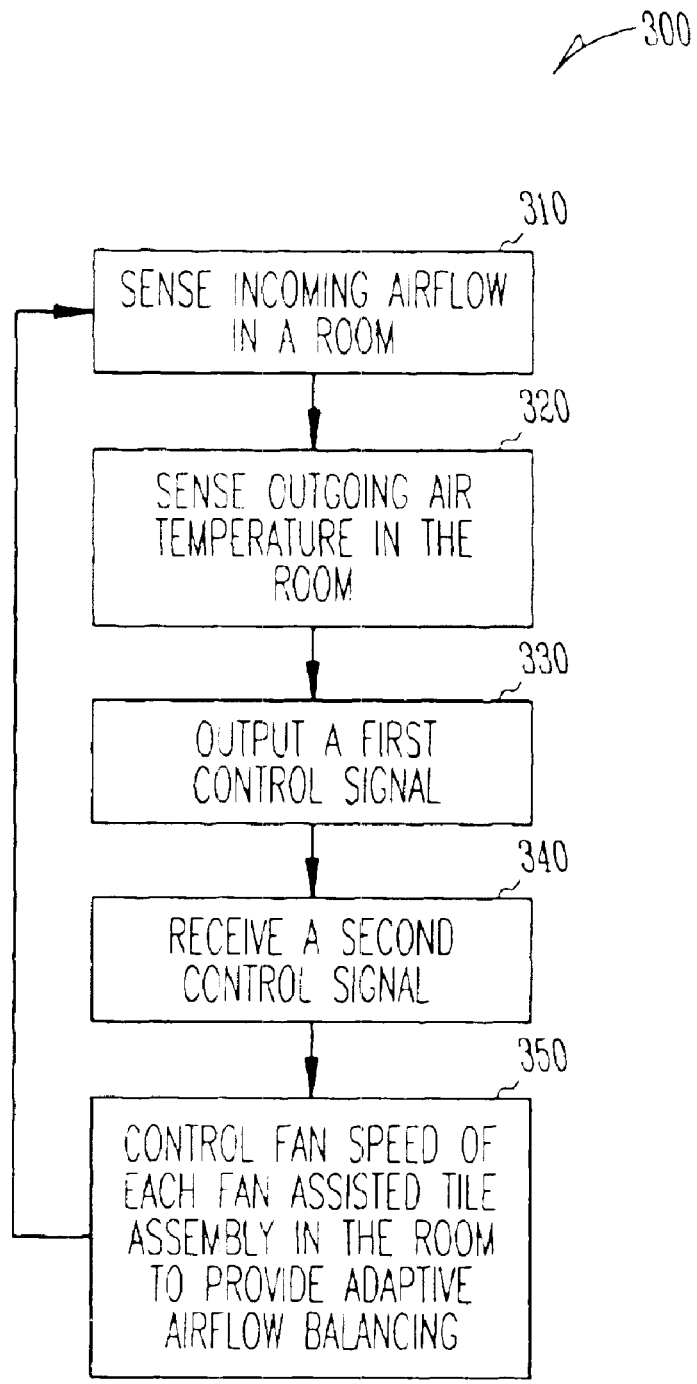
FIG. 3 is a flowchart illustrating a method of providing adaptive airflow balancing in a room, in accordance with one embodiment of the present subject matter.

Referring now to FIG. 3, there is illustrated an embodiment of a method 300 according to the present invention. At 310, the method 300 in this example embodiment senses incoming airflow into a room. At 320, the method 300 further senses outgoing air temperature. In this embodiment, the incoming airflow from a first array of fan assisted tiles and the outgoing air temperature from a second array of fan assisted tiles is sensed.

At 330 a first control signal is outputted based on the sensed airflow and temperature. In some embodiments, at 330 a Network address associated with each fan assisted tile along with the first control signal is outputted at 330. At 340 a second control signal is outputted based on the first control signal. In some embodiments, at 340 the second control signal is outputted along with the Network address associated with the fan assisted tile to be controlled.

At 350 fan speed of the one or more fans 172 in each fan assisted tile in the first and second arrays is controlled based on the second control signal to provide adaptive airflow balancing in the room. In some embodiments, the method 300 can include sensing the condition of each fan assisted tile and indicating a failed condition based on sensing the condition of each fan assisted tile. In these embodiments, the failed condition of a fan assisted tile can be indicated by sending an alarm or by lighting an indicator associated with the failed fan assisted tile.

The above method, blocks 310–350, repeats itself to maintain adaptive airflow balancing and provide thermal management in the room by varying the speed of fans to accommodate changes in traffic patterns, component changes and additions, blocked filters, failed fans and so on in the room. The room can be a computer data center including heat generating components.

Although the method 300 includes blocks 310–350 that are arranged serially in the exemplary embodiments, other embodiments of the subject matter may execute two or more blocks in parallel, using multiple processors or a single processor organized two or more virtual machines or sub-processors. Moreover, still other embodiments may implement the blocks as two or more specific interconnected hardware modules with related control and data signals communicated between and through the modules, or as portions of an application-specific integrated circuit. Thus, the exemplary process flow diagrams are applicable to software, firmware, and/or hardware implementations.

The various embodiments of the fan assemblies, systems, and methods described herein are applicable generically to achieve adaptive airflow balancing and thermal management in a computer data center. In addition, the above-described technique provides uniform airflow in every location in a computer data center, thus helping to improve operating efficiency and cooling performance of the computer data center. Further, the above-described technique provides adaptive air flow balancing in a computer data center under varying thermal load distributions. Furthermore, the above-described technique, after achieving an operational thermal balance, continues to monitor the steady state situation and compensates for thermal variability due to time dependent variations in traffic patterns, blocked filters, failed fans, and other such variations to provide a well-balanced airflow.

The above description is intended to be illustrative, and not restrictive. Many other embodiments will be apparent to those skilled in the art. The scope of the invention should therefore be determined by the appended claims, along with the full scope of equivalents to which such claims are entitled.

What is claimed is:

1. A thermal management system for a room having heat generating components, the system comprising:
   an array of fan assisted tiles;
   a fan controller coupled to each fan assisted tile; and
   a thermal server coupled to each fan controller through a data network to receive sensed data based on environmental characteristics in the room and to output a control signal to each fan controller so that fans of each fan assisted tile can be controlled to provide an adaptive airflow balancing in the room.

2. The thermal management system of claim 1, further comprises:
   sensors associated with each fan assisted tile, wherein the sensors are coupled to the thermal server, and wherein the sensors sense environmental characteristics in the room and output sensed data.

3. The thermal management system of claim 2, wherein in the sensed data comprises data based on environmental characteristics selected from the group consisting of airflow, temperature, humidity, and particle density.

4. The thermal management system of claim 3, wherein the sensed data comprises environmental characteristics of air coming into and out of the room.

5. The thermal management system of claim 1, wherein the thermal server is a remoter computer program capable of communicating over the data network.

6. The thermal management system of claim 1, wherein the thermal server to output the control signal to control the fans to vary the environmental characteristics of air coming into and out of the room.

7. A thermal management system for a room having heat generating components, the system comprising:
   a first array of fan assisted tiles having sensors to sense airflow, wherein the fan assisted tiles direct the airflow into the room;
   a second array of fan assisted tiles having sensors to sense temperature, wherein the fan assisted tiles direct the airflow out of the room; and
   a remote server, coupled to the fan assisted tiles through a data network, receive sensed airflow data and temperature data from the sensors and, outputs a control signal to vary fan speeds of each fan assisted tile in the first and second arrays.

8. The system of claim 7, wherein the fan speed of each fan in the first array is based on sensed airflow of the incoming air at the fans.

9. The system of claim 8, wherein the speed of each fan is varied based on the control signal to provide adaptive thermal balancing in the room based on sensed airflow.

10. The system of claim 7, wherein the fan speed of each fan in the second array is based on sensed temperatures of the outgoing air at the fans.

11. The system of claim 10, wherein the fan speed of each fan is varied based on the control signal to provide adaptive thermal balancing in the room based on sensed air temperature.

12. The system of claim 7, wherein the remote server to send an alarm to indicate a failed condition of a failed fan assisted tile.

13. A networked fan system for a computer data center, wherein the computer data center comprises a raised floor and a ceiling, comprising:
   a first array of fan assisted tiles disposed on the raised floor, wherein each fan assisted tile assembly in the first array comprises one or more fans, an airflow sensor to output a first control signal, a micro-controller to vary the speeds of one or more fans, a programmable switch to set a Network address, and an interface connectible to a power source;
   a second array of fan assisted tiles disposed on the ceiling, wherein each fan assisted tile assembly in the second array comprises the one or more fans, a temperature sensor to output a second control signal, a micro-controller to vary the speeds of the one or more fans, a programmable switch to set the Network address, and an interface connectible to the power source;
   a network coupled to the interface of each of the first and second array of fan assisted tiles; and
   a host computer connectible to the network, wherein the host computer receives the first control signal along with the Network address associated with each fan assisted tile assembly in the first array through the network and outputs a third command signal along with the associated Network address based on the first control signal, wherein the host computer receives the second control signal along with the Network address with each fan assisted tile assembly in the second array through the network and outputs a fourth command signal along with the associated Network address based on the second control signal, and wherein the micro-controller associated with each of the first and second array of fan assisted tiles receives the associated third and fourth command signals through the network and varies a speed of one or more fans associated with each of the first and second array of fan assisted tiles to provide adaptive airflow balancing in the computer data center.

14. The networked fan system of claim 13, wherein the first array of fan assisted tiles is disposed such that air is directed into the computer data center when the fan assemblies are in operation.

15. The networked fan system of claim 13, wherein the second array of fan assisted tiles is disposed such that the air is directed out of the computer data center.

16. The networked fan system of claim 13, wherein the interface comprises:
   daisy chainable connection to connect each interface to the power source and the network.

17. The networked fan system of claim 13, wherein each fan assisted tile assembly comprises a sheet metal tile having a plurality of passageways, wherein the sheet metal tile further has a front side and a back side, wherein the one or more fans are attached to the back side of the sheet metal tile, and the front side is adapted to be disposed in the raised floor or the ceiling.

18. A fan assembly, comprising:
   a fan tile adapted to be disposed in a raised floor or a ceiling of a room;
   one or more fans attached to the fan tile; and
   a fan controller coupled to the one or more fans and connectible to a host computer via a network, wherein the fan controller to sense environmental characteristics and to output a first control signal along with a Network address, wherein the fan controller receives a second control signal along with a Network address from the host computer via the network, wherein the second control signal is based on the first control signal, and wherein the fan controller varies the speed of the one or more fans based on the second control signal to provide adaptive airflow balancing in the room.

19. The fan assembly of claim 18, wherein the fan controller comprises:
   a power controller coupled to the one or more fans;
   a programmable switch coupled to the power controller to set the Network address;
   an interface coupled to the power controller and connectible to the host computer via the network; and
   a sensor connectible to the host computer via the interface to sense the air flow of air coming into the room or the air temperature of air going out of the room when the one or more fans are in operation and to output the first control signal based on the sensed temperature or airflow, wherein the power controller to receive the second control signal from the host computer based on the first control signal, and wherein the power controller to vary the one or more fans speed to provide adaptive airflow balancing based on the second control signal.

20. The fan assembly of claim 19, wherein the fan tile comprises a sheet metal tile.

21. The fan assembly of claim 19, wherein the one or more fans are one or more axial or radial fans.

22. The fan assembly of claim 19, wherein the sensor is selected from the group consisting of a temperature sensor, a humidity sensor, an airflow sensor, and a particle density sensor.

23. A remotely controlled fan assisted tile assembly for a computer data center, comprising:
   a fan tile adapted to be disposed in a raised floor or ceiling of a computer data-center;
   one or more fans attached to the fan tile such that the one or more fans, when in operation, aid in adaptive airflow balancing of the computer data center; and
   a fan controller coupled to the one or more fans and connectible to a host computer via a network, wherein the fan controller further comprises:
   a micro-controller;
   a programmable switch coupled to the micro-controller to set a unique identifier; and
   a sensor connectible to sense outgoing or incoming environmental characteristics when the one or more fans are in operation and to output a first control signal along with the unique identifier based on the sensed environmental characteristics, and wherein the micro-controller to receive a second control signal from the host computer based on the first control signal and the unique identifier, and wherein the micro-controller controls the one or more fans to provide adaptive airflow balancing based on the second control signal and the unique identifier.

24. The fan assisted tile assembly of claim 23, wherein the sensor is selected from the group consisting of a temperature sensor, an airflow sensor, a humidity sensor, and a particle density sensor.

25. The fan assisted tile assembly of claim 23, wherein the first control signal comprises data selected from the group consisting of temperature data and airflow data.

26. The fan assisted tile assembly of claim 23, wherein the second control signal comprises revolutions per minute (rpm) data.

27. The fan assisted tile assembly of claim 24, further comprising:

an interface, wherein the interface comprises a network interface and a power line interface, to daisy chain with other fan assemblies.

28. The fan assisted tile assembly of claim 27, wherein the network interface comprises a serial communication interface.

29. The fan assisted tile assembly of claim 23, further comprising:

an indicator to indicate a failed fan assisted tile assembly, wherein the indicator comprises devices selected from the group consisting of a light and an alarm.

30. A fan assisted tile assembly, comprising:

a fan tile adapted to be disposed in a raised floor or ceiling of a computer data center, wherein the fan tile has a front side and a back side, and wherein the fan tile further has multiple passageways;

one or more fans attached to the back side of the fan tile such that air passes through the multiple passageways when the one or more fans are in operation; and a fan controller coupled to the one or more fans, wherein the fan controller further comprises:

a power-controller coupled to the one or more fans;

a programmable switch coupled to the power-controller to set a Network address that is unique to the fan assembly;

an interface coupled to the power-controller; and a sensor connectible to a host computer via the interface to sense outgoing or incoming environmental characteristics and to output a first control signal, and wherein the power-controller is connectible to the host computer via the interface to receive a second control signal from the host computer based on the first control signal, and wherein the power-controller to vary the one or more fans speed to provide adaptive airflow balancing in the computer data center based on receiving the second control signal and the Network address.

31. The fan assisted tile assembly of claim 30, wherein the fan tile comprises a sheet metal tile.

32. The fan assisted tile assembly of claim 30, wherein the sensor is selected from the group consisting of a temperature sensor, an airflow sensor, a humidity sensor, and a particle density sensor.

33. The fan assisted tile assembly of claim 30, wherein the interface comprises a network interface and a power interface that can be daisy chained with other fan assisted tiles.

34. The fan assisted tile assembly of claim 30, further comprising:

an indicator to indicate a failed fan assisted tile assembly.

35. The system of claim 30, further comprising:

a means to indicate a failed fan assisted tile.

36. A method, comprising:

sensing environmental characteristics of incoming air and outgoing air from first and second arrays of fan assisted tiles disposed in a raised floor and a ceiling in a room, respectively; and controlling each fan assisted tile based on the environmental characteristics using a remote computer through a network to provide adaptive airflow balancing in the room.

37. The method of claim 36, wherein sensing environmental characteristics further comprises:

sensing incoming airflow from each of the first array of fan assisted tiles; and sensing outgoing air temperature in each of the second array of fan assisted tiles.

38. The method of claim 36, wherein controlling each fan assisted tile based on the environmental characteristics further comprises:

outputting a first control signal and an associated Network address by each fan assisted tile assembly to the remote computer based on the sensed environmental characteristics;

receiving a second control signal and the associated Network address by each fan assisted tile assembly; and controlling each fan assisted tile assembly based on the received second control signal and the associated Network address to provide adaptive airflow balancing in the room.

39. The method of claim 36, wherein the room is a computer data center.

40. The method of claim 36, further comprising:

sensing operating condition of each fan assisted tile in the first and second arrays; and indicating a failed condition of a fan assisted tile, based on the sensing of the condition of each of the fan assisted tiles, by sending an alarm or by lighting an indicator associated with the failed fan assisted tile.

41. A decentralized thermal management system for a room having heat generating components, the system comprising:

an array of fan assisted tiles;

a fan controller coupled to each fan assisted tile; and a thermal server coupled to each fan controller through a data network to send commands to each fan controller for adaptive airflow balancing in the room, wherein each fan controller controls each associated fan assisted tile based on the received commands to achieve a required adaptive airflow balancing in the room.

42. The thermal management system of claim 41, further comprises:

sensors associated with each fan assisted tile, wherein the sensors are coupled to the fan controller, and wherein the sensors sense environmental characteristics in the room and output sensed data.

43. The thermal management system of claim 42, wherein in the sensed data comprises data based on environmental characteristics selected from the group consisting of airflow, temperature, humidity, and particle density.

44. A distributed thermal management control system for a room having heat generating components, the system comprising:

an array of fan assisted tiles;

a fan controller coupled to each fan assisted tile;

sensors associated with each fan assisted tile, wherein the sensors are coupled to the fan controller, wherein the sensors sense environmental characteristics in the room and output sensed data; and a thermal server coupled to each fan controller through a data network to monitor each fan controller, wherein each fan controller controls each associated fan assisted tile based on sensed data received from associated sensors and other sensors coupled through the data network to achieve an adaptive airflow balancing in the room, wherein the thermal server outputs status conditions of each fan assisted tile.

45. The thermal management system of claim 44, wherein in the sensed data comprises data based on environmental characteristics selected from the group consisting of airflow, temperature, humidity, and particle density.

* * * * *